(12) United States Patent
Nakatani

(10) Patent No.: US 11,361,959 B2
(45) Date of Patent: Jun. 14, 2022

(54) METHOD FOR MANUFACTURING WAFER

(71) Applicant: SHIN-ETSU HANDOTAI CO., LTD., Tokyo (JP)

(72) Inventor: Yuya Nakatani, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 174 days.

(21) Appl. No.: 16/487,471

(22) PCT Filed: Feb. 27, 2018

(86) PCT No.: PCT/JP2018/007083
§ 371 (c)(1),
(2) Date: Aug. 21, 2019

(87) PCT Pub. No.: WO2018/168426
PCT Pub. Date: Sep. 20, 2018

(65) Prior Publication Data
US 2020/0006047 A1   Jan. 2, 2020

(30) Foreign Application Priority Data
Mar. 13, 2017   (JP) ............................. JP2017-047448

(51) Int. Cl.
*H01L 21/02*   (2006.01)
*H01L 21/304*   (2006.01)

(52) U.S. Cl.
CPC .. *H01L 21/02021* (2013.01); *H01L 21/02013* (2013.01); *H01L 21/02024* (2013.01); *H01L 21/304* (2013.01)

(58) Field of Classification Search
None
See application file for complete search history.

(56) References Cited

U.S. PATENT DOCUMENTS

| | | | | |
|---|---|---|---|---|
| 6,174,222 B1* | 1/2001 | Sato | ........................ | B24B 9/065 451/44 |
| 2009/0324896 A1* | 12/2009 | Kato | ........................ | B24B 9/065 428/192 |

FOREIGN PATENT DOCUMENTS

| JP | 2001-334448 A | 12/2001 |
|---|---|---|
| JP | 2004-319910 A | 11/2004 |

(Continued)

OTHER PUBLICATIONS

May 15, 2018 Search Report issued in International Patent Application No. PCT/JP2018/007083.

(Continued)

*Primary Examiner* — Stephanie P Duclair
(74) *Attorney, Agent, or Firm* — Oliff PLC

(57) ABSTRACT

A method for manufacturing a wafer product, including the steps of: chamfering a circumferential edge portion of a wafer; lapping or double-side grinding main surfaces thereof; etching; mirror-polishing the main surface; and mirror-polishing the chamfered portion. The chamfered portion has a cross-sectional shape including: a first inclined portion continuous from the first main surface; a first arc portion continuous from the first inclined portion and having a radius of curvature; a second inclined portion continuous from the second main surface; a second arc portion continuous from the second inclined portion and having a radius of curvature; and an end portion connecting the first arc portion to the second arc portion. This provides a method for manufacturing a wafer by which a variation in a chamfered cross-sectional shape in a circumferential direction caused by etching can be suppressed.

8 Claims, 6 Drawing Sheets

(56) References Cited

FOREIGN PATENT DOCUMENTS

| | | |
|---|---|---|
| JP | 2015-153999 A | 8/2015 |
| KR | 10-2009-0115717 A | 11/2009 |
| KR | 10-2010-0015163 A | 2/2010 |
| WO | 2008/093488 A1 | 8/2008 |

OTHER PUBLICATIONS

Feb. 10, 2022 Office Action issued in Korean Patent Application No. 2019-7026388.

* cited by examiner

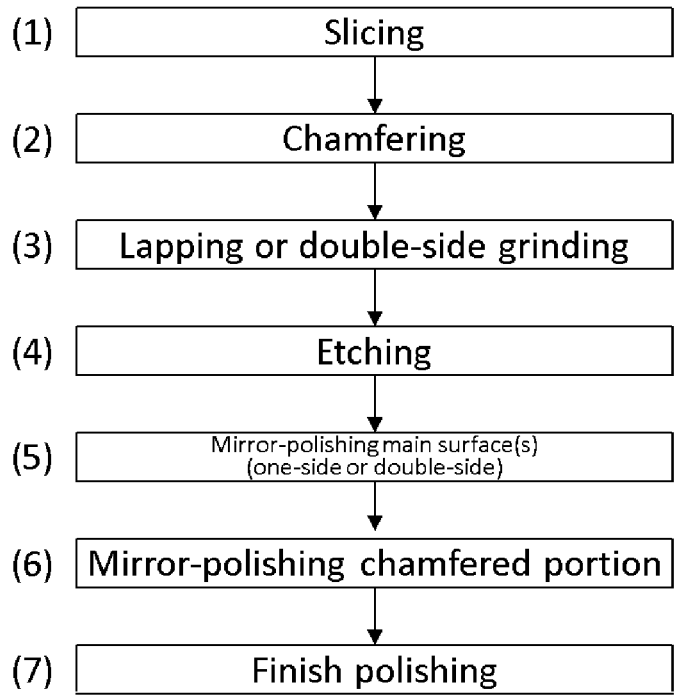
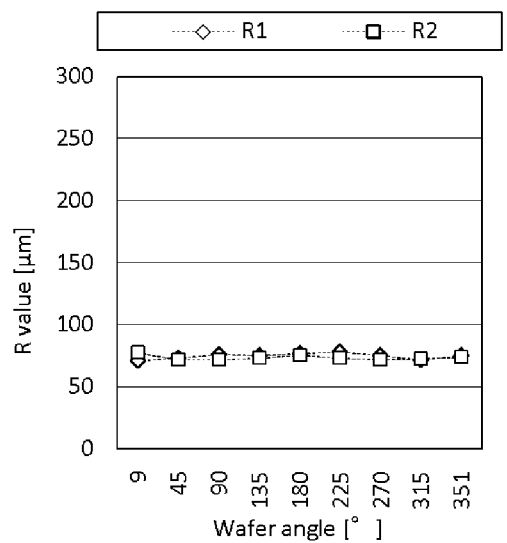

[FIG. 3]
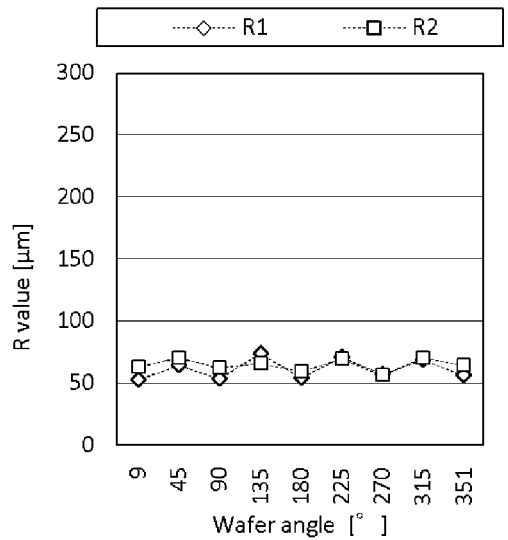
[FIG. 4]
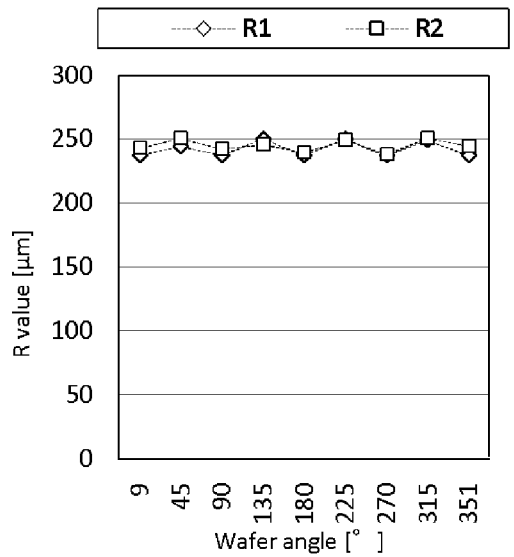
[FIG. 5]
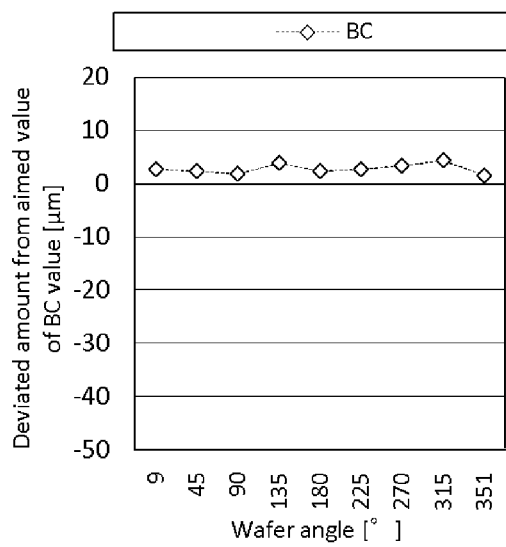

[FIG. 6]
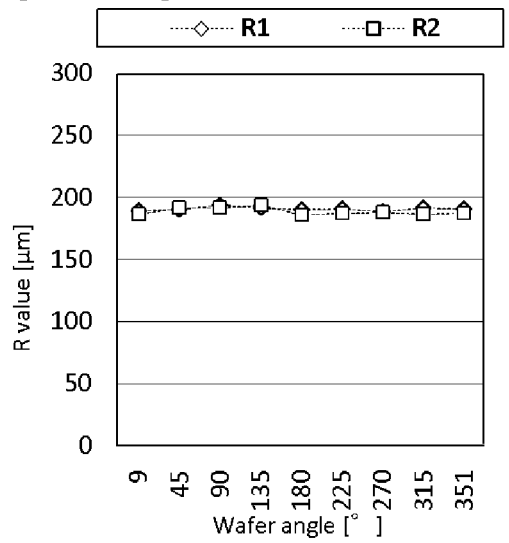
[FIG. 7]
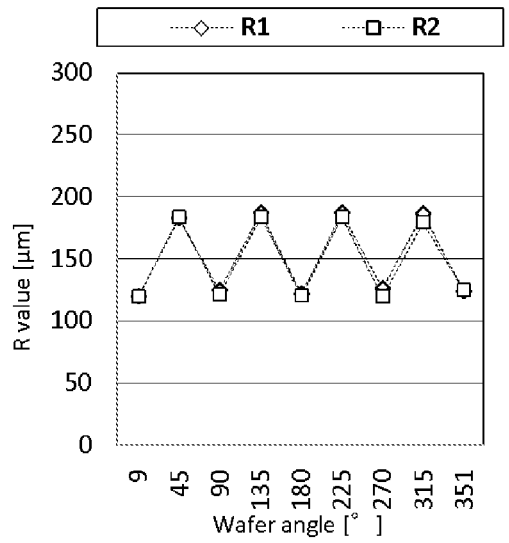
[FIG. 8]
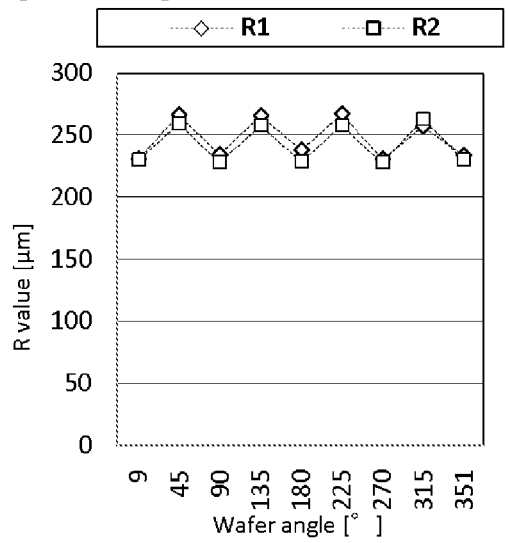

[FIG. 9]
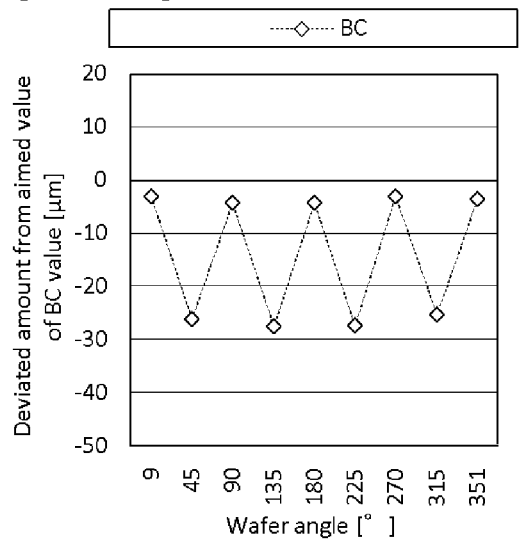
[FIG. 10]
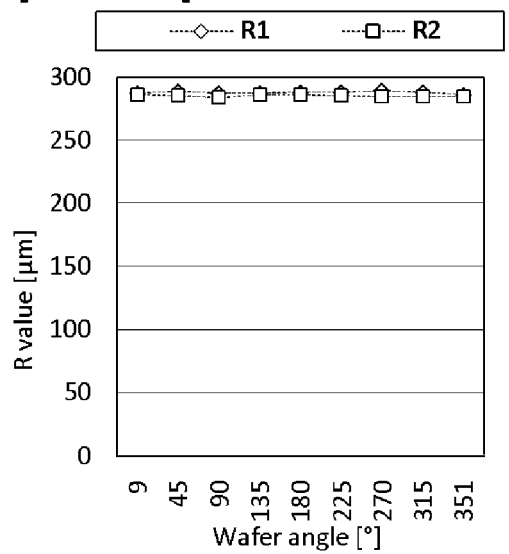
[FIG. 11]
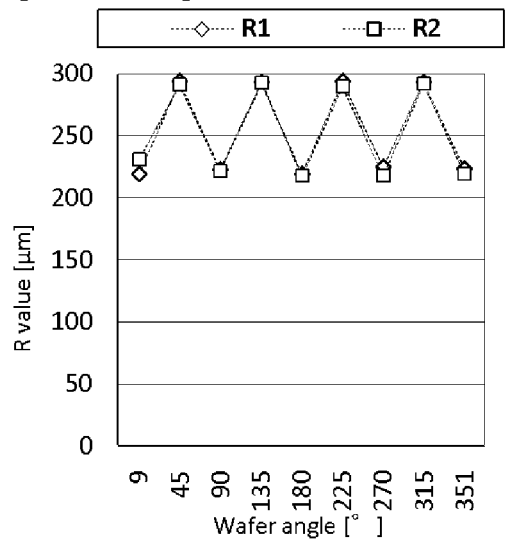

[FIG. 12]
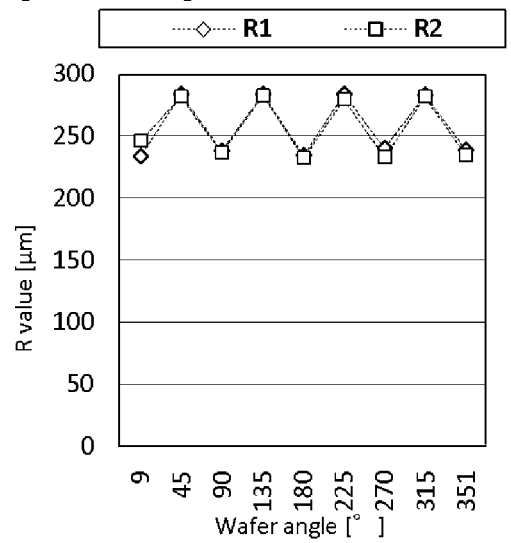
[FIG. 13]
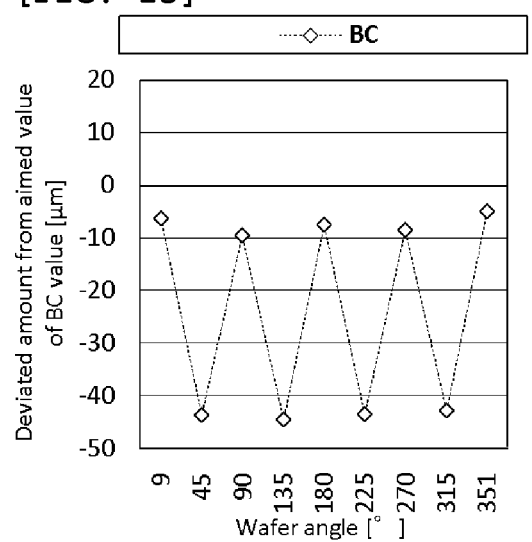

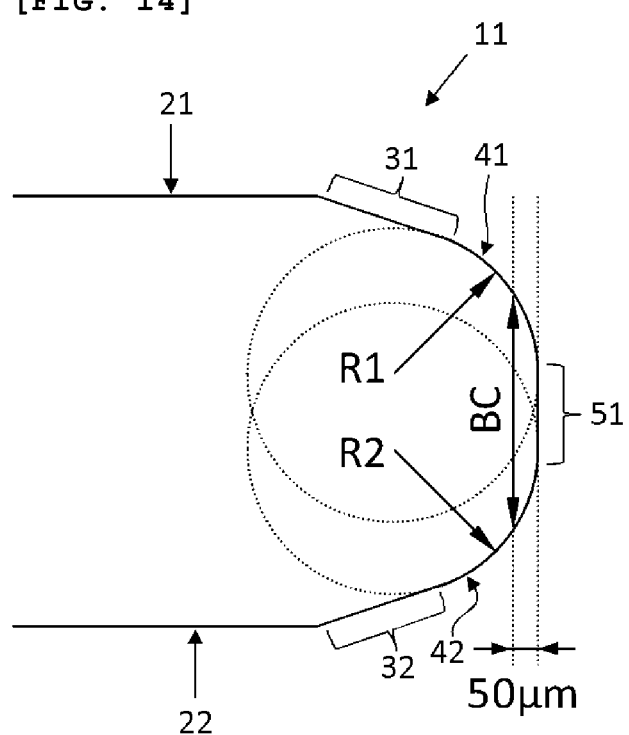
[FIG. 14]

METHOD FOR MANUFACTURING WAFER

TECHNICAL FIELD

The present invention relates to a method for manufacturing a wafer.

BACKGROUND ART

In a method for manufacturing a semiconductor wafer, the following steps are successively performed in general: (a) a slicing step for cutting a thin wafer from a single crystal ingot, (b) a chamfering step for preventing cracking of an outer circumferential portion of the wafer, (c) a lapping step or double-side grinding step for eliminating the thickness variation of the wafer, (d) an etching step for removing processing damage or contaminant introduced by the chamfering, the lapping, or the grinding, (e) a mirror-polishing step for polishing one or both of main surfaces of the wafer to a mirror finish, and (f) a mirror-polishing step for polishing the chamfered portion to a mirror finish.

The etching step includes, for example, acid etching using an acid mixture containing hydrofluoric acid, nitric acid, acetic acid, and the like; and alkali etching using an alkali such as sodium hydroxide or potassium hydroxide.

The acid etching is advantageous in that the etching rate and the surface state are easily controlled, but also has such a disadvantage that its high etching rate decreases the flatness of the wafer which had been improved by the lapping and double-side grinding.

Meanwhile, the alkali etching can keep the wafer flatness because of its low etching rate, and has such an advantage that a wafer having an excellent flatness can be obtained after the etching.

Recently, alkali etching has been widely employed so as to meet strict flatness requirements.

CITATION LIST

Patent Literature

Patent Document 1: International Publication No. WO2008/093488
Patent Document 2: Japanese Unexamined Patent Application Publication No. 2015-153999

SUMMARY OF INVENTION

Technical Problem

However, particularly in alkali etching, since the etching speed differs depending on the crystal orientation, etching amounts from outermost circumferential and curved portions of the chamfered portion differ depending on the crystal orientation angle. As a result, the chamfered cross-sectional shape varies from place to place in the circumferential direction.

Meanwhile, the stock removal in the mirror-polishing of the chamfered portion performed in the later process is uniform in the circumferential direction. Hence, the variation in the circumferential direction caused by the alkali etching remains in dimensions of the chamfered cross-sectional shape. This brings about a problem of hindering a uniform chamfered cross-sectional shape in the circumferential direction.

In view of the above-described problem, an object of the present invention is to provide a method for manufacturing a wafer by which a variation in a chamfered cross-sectional shape in a circumferential direction caused by etching can be suppressed.

Solution to Problem

The present invention has been made to achieve the object, and provides a method for manufacturing a wafer as a product, including the steps of:
grinding and chamfering a circumferential edge portion of a wafer sliced from a single crystal ingot;
lapping or double-side grinding main surfaces of the chamfered wafer;
etching the lapped or double-side ground wafer;
one-side or double-side mirror-polishing main surfaces of the etched wafer; and
mirror-polishing a chamfered portion of the mirror-polished wafer, wherein
after the chamfering step, the chamfered portion of the wafer has a cross-sectional shape including:
a first inclined portion continuous from a first main surface, which is one of the main surfaces of the wafer, and inclined from the first main surface;
a first arc portion which is an arc-shaped portion continuous from the first inclined portion and has a radius of curvature R1;
a second inclined portion continuous from a second main surface, which is another main surface of the wafer, and inclined from the second main surface;
a second arc portion which is an arc-shaped portion continuous from the second inclined portion and has a radius of curvature R2;
an end portion which connects the first arc portion to the second arc portion and constitutes an outermost circumferential end portion of the wafer,
in the chamfering, the wafer to be a product is chamfered such that the chamfered wafer has the R1 and the R2 which are smaller than a target value range of the R1 and the R2 of the wafer product, and
in the mirror-polishing of the chamfered portion, the chamfered portion is mirror-polished such that the mirror-polished chamfered portion has the R1 and the R2 which are within the target value range of the R1 and the R2 of the wafer product to thus manufacture the wafer product.

Such a method for manufacturing a wafer makes it possible to manufacture a wafer product having the R1 and R2 within the target value range, the wafer having a uniform chamfered cross-sectional shape in the circumferential direction in comparison with wafers manufactured by the conventional techniques.

Moreover, the chamfering is preferably performed such that the R1 and R2 are within a range of 50 μm or more and 200 μm or less.

By performing the chamfering to attain such a range, it is possible to more effectively achieve the uniformity of the chamfered cross-sectional shape in the circumferential direction in the wafer product.

Further, in the method for manufacturing a wafer, the etching can be performed using an alkaline aqueous solution.

Such etching using an alkaline aqueous solution makes it easy to keep the flatness of the main surfaces of the wafer. In addition, the inventive method for manufacturing a wafer can be particularly suitably adopted when alkali etching is performed using an alkaline aqueous solution which is likely to affect the distribution of a chamfered cross-sectional shape in a wafer circumferential direction.

Additionally, the single crystal ingot can be a single crystal silicon ingot.

The inventive method for manufacturing a wafer can be particularly suitably employed in a process for manufacturing a single crystal silicon wafer obtained from a single crystal silicon ingot.

Advantageous Effects of Invention

The inventive method for manufacturing a wafer makes it possible to manufacture a wafer product having R1 and R2 within a target value range, the wafer having a uniform chamfered cross-sectional shape in the circumferential direction in comparison with wafers manufactured by the conventional techniques. Particularly, even when the etching is performed with an alkali which is likely to affect the chamfered cross-sectional shape in the wafer circumferential direction, it is possible to manufacture a wafer having a uniform chamfered cross-sectional shape in the circumferential direction.

BRIEF DESCRIPTION OF DRAWINGS

FIG. 1 is a flow chart for illustrating an example of a method for manufacturing a wafer according to the present invention.

FIG. 2 is a graph for illustrating changes in chamfered cross-sectional shape dimensions of an R1 value and an R2 value in a circumferential direction after chamfering according to Example 1.

FIG. 3 is a graph for illustrating changes in the chamfered cross-sectional shape dimensions of the R1 value and the R2 value in the circumferential direction after etching according to Example 1.

FIG. 4 is a graph for illustrating changes in the chamfered cross-sectional shape dimensions of the R1 value and the R2 value in the circumferential direction after a chamfered portion is mirror-polished according to Example 1.

FIG. 5 is a graph for illustrating changes in a chamfered cross-sectional shape dimension of a BC value in the circumferential direction after the chamfered portion is mirror-polished according to Example 1.

FIG. 6 is a graph for illustrating changes in chamfered cross-sectional shape dimensions of an R1 value and an R2 value in a circumferential direction after chamfering according to Example 2.

FIG. 7 is a graph for illustrating changes in the chamfered cross-sectional shape dimensions of the R1 value and the R2 value in the circumferential direction after etching according to Example 2.

FIG. 8 is a graph for illustrating changes in the chamfered cross-sectional shape dimensions of the R1 value and the R2 value in the circumferential direction after a chamfered portion is mirror-polished according to Example 2.

FIG. 9 is a graph for illustrating changes in a chamfered cross-sectional shape dimension of a BC value in the circumferential direction after the chamfered portion is mirror-polished according to Example 2.

FIG. 10 is a graph for illustrating changes in chamfered cross-sectional shape dimensions of an R1 value and an R2 value in a circumferential direction after chamfering according to Comparative Example.

FIG. 11 is a graph for illustrating changes in the chamfered cross-sectional shape dimensions of the R1 value and the R2 value in the circumferential direction after etching according to Comparative Example.

FIG. 12 is a graph for illustrating changes in the chamfered cross-sectional shape dimensions of the R1 value and the R2 value in the circumferential direction after a chamfered portion is mirror-polished according to Comparative Example.

FIG. 13 is a graph for illustrating changes in a chamfered cross-sectional shape dimension of a BC value in the circumferential direction after the chamfered portion is mirror-polished according to Comparative Example.

FIG. 14 is a schematic sectional view for explaining the chamfered cross-sectional shape dimensions of the R1 value, the R2 value, and the BC value.

DESCRIPTION OF EMBODIMENTS

Hereinafter, embodiments of the present invention will be described. However, the present invention is not limited thereto.

As described above, a method for manufacturing a wafer has been sought which can solve the problem of a variation in a chamfered cross-sectional shape in a circumferential direction caused by etching, particularly alkali etching.

The present inventor has earnestly studied to achieve the above-described object. Consequently, the inventor has found that the above problem can be solved by the following procedure: a chamfering stage in which the processing is performed such that the resulting arc portions have radii of curvature R1 and R2 smaller than R1 and R2 values in a specification range of chamfered shape in a final wafer product; and a stage of mirror-polishing the chamfered portion in which the mirror-polishing is performed such that the resulting R1 and R2 are within the specification range. This finding has led to the completion of a method for manufacturing a wafer of the present invention.

Heretofore, against the problem that alkali etching causes non-uniform chamfered cross-sectional shape at a wafer circumferential edge portion, various countermeasures have been proposed (for example, Patent Documents 1, 2). However, conventionally, R1 and R2 in the chamfering stage have not been set smaller than a specification of a final wafer, unlike the present invention. Particularly, in the conventional approach, in order that the R1 and R2 of arc portions of a final wafer are within a specification range, arc portions immediately after chamfering are designed to have R1 and R2 equivalent to those of the final wafer; meanwhile, the step of mirror-polishing the chamfered portion is performed so as not to greatly change the R1 and R2 of the arc portions.

Hereinafter, the present invention will be described in more details with reference to the drawings. FIG. 1 is a flow for illustrating an example of the inventive method for manufacturing a wafer.

First, as shown in FIG. 1(1), a single crystal ingot is sliced to obtain a sliced wafer (step 1). As the single crystal ingot in this event, a single crystal silicon ingot can be used. The inventive method for manufacturing a wafer can be particularly suitably employed in a process for manufacturing a semiconductor wafer, especially a single crystal silicon wafer obtained from a single crystal silicon ingot.

Next, as shown in FIG. 1(2), a circumferential edge portion of the wafer sliced from the single crystal ingot in step 1 described above is ground and chamfered (step 2).

Here, the cross-sectional shape of the chamfered portion of the wafer after the chamfering step (chamfered cross-sectional shape) will be described with reference to FIG. 14. FIG. 14 shows a wafer circumferential edge portion 11. The wafer has two main surfaces 21, 22. For convenience, one of the main surfaces is referred to as a first main surface 21, and another main surface is referred to as a second main surface 22. The chamfered cross-sectional shape has: a first inclined portion 31 continuous from the first main surface 21, which is one of the main surfaces of the wafer, and inclined from the first main surface 21; and a first arc portion 41 which is an arc-shaped portion continuous from the first inclined portion 31 and has a radius of curvature R1. Moreover, this chamfered cross-sectional shape has: a second inclined portion 32 continuous from the second main surface 22, which is another main surface of the wafer, and inclined from the second main surface 22; and a second arc portion 42 which is an arc-shaped portion continuous from the second inclined portion 32 and has a radius of curvature R2. Further, the chamfered cross-sectional shape has an end portion 51 which connects the first arc portion 41 to the second arc portion 42 and constitutes an outermost circumferential end portion of the wafer. The end portion 51 can be substantially planar.

Here, among the dimensions of the chamfered cross-sectional shape shown in FIG. 14, R1 is the radius of curvature of the first arc portion 41 as described above, and R2 is the radius of curvature of the second arc portion 42 as described above. As another dimension of the chamfered cross-sectional shape, a "BC value" can be defined. This BC value indicates a thickness of a wafer at a position 50 μm from the outermost circumferential end of the wafer toward the inside of the wafer (see FIG. 14).

In the present invention, in this step 2 of chamfering, the wafer to be a product is chamfered such that the chamfered wafer has R1 and R2 which are smaller than a target value (i.e., wafer product specification) range of the R1 and R2 of the wafer product.

For example, in a specification of a final wafer product, when the chamfered cross-sectional shape dimensions of the R1 value and the R2 value are predetermined to be 250 μm or more and 300 μm or less, the chamfering is performed in the chamfering stage such that the resulting R1 value and R2 value are less than 250 μm. In the present invention, the circumferential edge portion of the sliced wafer is preferably ground and chamfered such that the chamfered cross-sectional shape dimensions of the R1 value and the R2 value are particularly within a range of 50 μm or more and 200 μm or less. In this event, the chamfered cross-sectional shape dimensions of the R1 value and the R2 value are more preferably 50 μm or more and 150 μm or less. Moreover, the chamfered cross-sectional shape dimensions of the R1 value and the R2 value are particularly preferably 50 μm or more and 100 μm or less.

In the present invention, the smaller the chamfered cross-sectional shape dimensions of the R1 value and the R2 value, the more preferable from the viewpoint that a variation in a chamfered cross-sectional shape in a circumferential direction caused by etching (particularly alkali etching) can be further suppressed. On the other hand, the chamfered cross-sectional shape dimensions of the R1 value and the R2 value are preferably 50 μm or more as described above so as to suppress cracking, chipping, and breaking from the wafer outer periphery in processing steps performed after the chamfering, as well as cracking, chipping, and breaking from the wafer outer periphery due to contact between the wafer and a handling jig.

After chamfering step 2 as described above, the main surfaces of the chamfered wafer are then lapped or double-side ground as shown in FIG. 1(3) (step 3).

Next, to remove processing damage introduced by the processing such as chamfering and/or lapping, the lapped or double-side ground wafer is etched as shown in FIG. 1(4) (step 4). In this event, the etching is preferably performed using an alkaline aqueous solution. As the alkaline aqueous solution, a sodium hydroxide aqueous solution or a potassium hydroxide aqueous solution can be used suitably. In this way, when the etching is performed using an alkaline aqueous solution such as a sodium hydroxide aqueous solution or a potassium hydroxide aqueous solution, the etching can be performed while relatively suppressing a change in the shape of the wafer main surfaces due to the etching, so that a flatter wafer can be obtained.

Meanwhile, as described above, when alkali etching is performed on a wafer, etching anisotropy causes a variation in a chamfered cross-sectional shape in a circumferential direction. Nevertheless, as in the present invention, the smaller the chamfered cross-sectional shape dimensions of the R1 value and the R2 value after the chamfering, the further the variation in a chamfered cross-sectional shape in a circumferential direction caused by alkali etching can be suppressed.

Next, as shown in FIG. 1(5), main surfaces of the etched wafer are subjected to one-side or double-side mirror-polishing (step 5).

Next, as shown in FIG. 1(6), a chamfered portion of the wafer having the mirror-polished main surface(s) is mirror-polished (step 6). In this mirror-polishing of the chamfered portion, the processing is performed such that the resulting R1 and R2 are within the target value range of the R1 and the R2 of the wafer product. This mirror-polishing of the chamfered portion in step 6 makes it possible to increase the small R1 and R2 having been formed by the chamfering in step 2. Thus, even when the R1 and R2 smaller than the specification of the final wafer product are formed in step 2, the R1 and R2 can be within the specification range in step 6.

Next, as shown in FIG. 1(7), as necessary, the main surface(s) of the wafer may be subjected to finish polishing (step 7).

After the steps as described above, the wafer product is manufactured. Such a method for manufacturing a wafer as described above can solve the conventional problem of a variation in a chamfered cross-sectional shape in a circumferential direction particularly caused by alkali etching and can manufacture a wafer having a precise chamfered shape with less variation.

The present invention should include, as described above: the chamfering stage in which R1 and R2 are set smaller than the target value range of the final wafer product; and the stage of mirror-polishing the chamfered portion in which the mirror-polishing is performed such that the resulting R1 value and R2 value are within the target value range. The inventive method may include various steps other than these stages. For example, as necessary, a cleaning step, a heating step, or the like may be performed before and after each step described above according to normal procedures.

EXAMPLE

Hereinafter, the present invention will be more specifically described with reference to Examples and Comparative Example. However, the present invention is not limited to these Examples. Note that all measurement values shown in FIGS. 2 to 13 to be described below were measured with an edge profiler LEP manufactured by KOBELCO Research Institute, Inc.

Example 1

A wafer was prepared as follows while the target values of R1, R2 of the final wafer product were set to 220 μm or more and 300 μm or less.

First, a single crystal silicon ingot was sliced to obtain a sliced wafer (step 1). Next, a grinding wheel was rotated at high speed. The grinding wheel used had a groove shape designed to make the chamfered cross-sectional shape dimensions of the R1 value and the R2 value within a range of 50 μm or more and 100 μm or less. After the slicing step, a circumferential edge portion of the silicon wafer held on a holding stage was brought into contact with the grinding wheel, and chamfered by rotating the wafer (step 2).

At this point (immediately after the chamfering in step 2), the chamfered cross-sectional shape dimensions of the R1 value and the R2 value were measured at nine spots inside the circumference of the silicon wafer, specifically, nine positions at intervals of 45°, including 9° and 351°, with respect to a notch. FIG. 2 shows this result. As shown in FIG. 2, the R1 and R2 were 50 μm or more and 100 μm or less at any spot in the wafer circumferential direction. An R1max–R1min value was 7.3 μm, where R1max is the maximum value of R1, R1min is the minimum value of R1, and R1max–R1min is a difference between R1max and R1min. A value of R2max–R2min was 6.0 μm, where R2max is the maximum value of R2, R2min is the minimum value of R2, and R2max–R2min is a difference between R2max and R2min.

Next, the silicon wafer after the chamfering step was double-side ground (step 3). More specifically, two grinding wheels having diamond abrasive grains were respectively pressed against two surfaces of the silicon wafer, while a grinding solution was supplied in the grinding wheels. The double-side grinding was performed by rotating the wafer under this condition.

Next, the silicon wafer after the double-side grinding step was immersed for 10 minutes in a sodium hydroxide aqueous solution with a mass concentration of about 52% and having been heated to a liquid temperature of about 75° C. Thereby, etching was performed with the etching removal of about 20 μm in thickness (step 4). After the alkali etching step, the chamfered cross-sectional shape dimensions of the silicon wafer were measured at the same positions as above and under the same conditions as the above measurement conditions. FIG. 3 shows the result. As shown in FIG. 3, the chamfered cross-sectional shape immediately after the alkali etching step further differed among the measurement spots (R1max–R1min value: 21.6 μm, R2max–R2min value: 14.4 μm) than that in FIG. 2. Nevertheless, in comparison with a chamfered cross-sectional shape immediately after etching in Comparative Example to be described later (FIG. 11), the uniformity of each R1, R2 was greatly improved in the circumferential direction.

Next, the two surfaces of the silicon wafer after the etching step were mirror-polished (step 5). More specifically, the silicon wafer was held in a holding hole of a carrier for a double-side polishing apparatus. The wafer was sandwiched between polishing pads attached to an upper turn table and a lower turn table of the double-side polishing apparatus. The two surfaces were mirror-polished by rotating the turn tables while a polishing agent was supplied to the surfaces to be polished.

Next, the chamfered portion was mirror-polished with a IV type mirror edge polishing apparatus manufactured by SpeedFam Company Limited such that the aimed value of R1, R2 was 250 μm (step 6). After the step of mirror-polishing the chamfered portion, the chamfered cross-sectional shape dimensions of the silicon wafer were measured at the same positions as above. The measurement result of the chamfered cross-sectional shape dimensions of the R1 value and the R2 value in this case is shown in FIG. 4, and that of the BC value is shown in FIG. 5. In FIG. 5, differences from each aimed value of the BC value are shown. As shown in FIG. 4, the distribution widths of both R1 and R2 in the circumferential direction are small (R1max–R1min value: 21.6 μm, R2max–R2min value: 14.4 μm). This can be understood particularly from the comparison with FIG. 12 to be described later. Moreover, in FIG. 4, the R1, R2 of the wafer were both approximately 235 to 255 μm, which can be recognized as being satisfactorily within the target value range. Meanwhile, as shown in FIG. 5, the deviated difference between the BC value of the final wafer and the aimed value of the BC value was small (a BCmax–BCmin value was 2.8 μm, where BCmax is the maximum value of the deviation from the aimed value of BC value, BCmin is the minimum value of the deviation from the aimed value of BC value, and BCmax–BCmin is a difference between BCmax and BCmin), and the distribution was also uniform.

Example 2

A sliced wafer was obtained by the same method as in Example 1, and then chamfered with a grinding wheel by the same method as in Example 1. The grinding wheel used had a groove shape designed to make the chamfered cross-sectional shape dimensions of the R1 value and the R2 value within 150 to 200 μm.

Next, the double-side grinding, alkali etching, double-side mirror-polishing, and chamfered-portion mirror-polishing were successively performed by the same method as in Example 1.

As in Example 1, after the chamfering step, after the alkali etching step, and after the chamfered-portion mirror-polishing step, the chamfered cross-sectional shape dimensions were measured at the same positions as in Example 1 and under the same conditions as the above measurement conditions. FIG. 6 shows the chamfered cross-sectional shape dimensions of the R1 value and the R2 value after the chamfering step. FIG. 7 shows the chamfered cross-sectional shape dimensions of the R1 value and the R2 value after the alkali etching step. FIG. 8 shows the chamfered cross-sectional shape dimensions of the R1 value and the R2 value, and FIG. 9 shows the BC value, after the chamfered-portion mirror-polishing step.

Comparative Example

A sliced wafer was obtained by the same method as in Example 1, and then chamfered with a grinding wheel by the same method as in Example 1. The grinding wheel used had a groove shape designed to make the chamfered cross-sectional shape dimensions of the R1 value and the R2 value within 250 to 300 μm. In other words, from the chamfering stage, the R1 value and R2 value were targeted to be within the specification range of the final wafer product.

Next, the double-side grinding, alkali etching, double-side mirror-polishing, and chamfered-portion mirror-polishing were successively performed by the same method as in Example 1.

As in Example 1, after the chamfering step, after the alkali etching step, and after the chamfered-portion mirror-polishing step, the chamfered cross-sectional shape dimensions were measured at the same positions as in Example 1 and under the same conditions as the above measurement conditions. FIG. 10 shows the chamfered cross-sectional shape dimensions of the R1 value and the R2 value after the chamfering step. FIG. 11 shows the chamfered cross-sectional shape dimensions of the R1 value and the R2 value after the alkali etching step. FIG. 12 shows the chamfered cross-sectional shape dimensions of the R1 value and the R2 value, and FIG. 13 shows the BC value, after the chamfered-portion mirror-polishing step.

Table 1 summarizes the R1max–R1min value, R2max–R2 min value, and BCmax–BCmin value of each wafer finally obtained in Examples 1, 2 and Comparative Example.

TABLE 1

|  | Example 1 | Example 2 | Comparative Example |
|---|---|---|---|
| R1max – R1min [μm] | 13.4 | 36.3 | 49.9 |
| R2max – R2min [μm] | 12.4 | 35.4 | 50.1 |
| BCmax – BCmin [μm] | 2.8 | 24.4 | 50.1 |

As shown in Table 1, in comparison with the wafer of Comparative Example chamfered to make the chamfered cross-sectional shape dimensions of the R1 value and the R2 value within 250 to 300 μm, the wafer of Example 1 chamfered to make the chamfered cross-sectional shape dimensions of the R1 value and the R2 value within 50 to 100 μm and the wafer of Example 2 chamfered to make the chamfered cross-sectional shape dimensions of the R1 value and the R2 value within 150 to 200 μm make it possible to manufacture wafers having chamfered cross-sectional shapes in which the R1 value, R2 value, and BC value are uniform in the circumferential direction. Moreover, the comparison between Example 1 and Example 2 reveals that Example 1 in which the R1 value and R2 value were the smaller in the chamfering stage enables manufacturing of a wafer product having a more uniform chamfered cross-sectional shape in the circumferential direction.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a wafer as a product, the method comprising the steps of:
grinding and chamfering a circumferential edge portion of a wafer sliced from a single crystal ingot;
lapping or double-side grinding main surfaces of the chamfered wafer;
etching the lapped or double-side ground wafer;
one-side or double-side mirror-polishing main surfaces of the etched wafer; and
mirror-polishing a chamfered portion of the mirror-polished wafer,
wherein after the chamfering step, the chamfered portion of the wafer has a cross-sectional shape comprising:
a first inclined portion continuous from a first main surface, which is one of the main surfaces of the wafer, and inclined from the first main surface;
a first arc portion which is an arc-shaped portion continuous from the first inclined portion and has a radius of curvature R1;
a second inclined portion continuous from a second main surface, which is another main surface of the wafer, and inclined from the second main surface;
a second arc portion which is an arc-shaped portion continuous from the second inclined portion and has a radius of curvature R2; and
an end portion which connects the first arc portion to the second arc portion and constitutes an outermost circumferential end portion of the wafer,
in the chamfering, the wafer to be a product is chamfered such that the chamfered wafer has the R1 and the R2 which are smaller than a target value range of the R1 and the R2 of the wafer product, and
in the mirror-polishing of the chamfered portion, the chamfered portion is mirror-polished such that the mirror-polished chamfered portion has the R1 and the R2 which are within the target value range of the R1 and the R2 of the wafer product to thus manufacture the wafer product.

2. The method for manufacturing a wafer according to claim 1, wherein the chamfering is performed such that the R1 and R2 are within a range of 50 μm or more and 200 μm or less.

3. The method for manufacturing a wafer according to claim 2, wherein the etching is performed using an alkaline aqueous solution.

4. The method for manufacturing a wafer according to claim 3, wherein the single crystal ingot is a single crystal silicon ingot.

5. The method for manufacturing a wafer according to claim 2, wherein the single crystal ingot is a single crystal silicon ingot.

6. The method for manufacturing a wafer according to claim 1, wherein the etching is performed using an alkaline aqueous solution.

7. The method for manufacturing a wafer according to claim 6, wherein the single crystal ingot is a single crystal silicon ingot.

8. The method for manufacturing a wafer according to claim 1, wherein the single crystal ingot is a single crystal silicon ingot.

* * * * *